United States Patent [19]

Yano et al.

[11] Patent Number: 4,899,359
[45] Date of Patent: Feb. 6, 1990

[54] OPTICAL MEMORY SEMICONDUCTOR LASER APPARATUS

[75] Inventors: Seiki Yano, Kashihara; Toshiki Hijikata, Nara, both of Japan

[73] Assignee: Sharp Kabushiki Kaisha, Osaka, Japan

[21] Appl. No.: 283,013

[22] Filed: Dec. 8, 1988

Related U.S. Application Data

[63] Continuation of Ser. No. 870,511, Jun. 4, 1986, abandoned.

[51] Int. Cl.⁴ .................................................. H01S 3/19
[52] U.S. Cl. .................................... 372/44; 372/46; 372/48; 372/50
[58] Field of Search .................... 372/50, 48, 49, 45, 372/46

[56] References Cited

FOREIGN PATENT DOCUMENTS

| 0061220 | 9/1982 | European Pat. Off. |
| 0086008 | 8/1983 | European Pat. Off. |
| 0097035 | 12/1983 | European Pat. Off. |
| 0107886 | 6/1985 | Japan ................................. 372/50 |
| 0287289 | 12/1986 | Japan ................................. 372/43 |

OTHER PUBLICATIONS

Patent Abstracts of Japan, vol. 9, No. 19 (E-292) (1742), 25th Jan. 1985; & JP-A-59 165 487 (Sharp K.K.) 18-09-1984) * Abstract *.

Applied Physics Letters, vol. 43, No. 10, Nov. 1983, pp. 903-905, American Institute of Physics, New York, U.S.; M. Wada et al.: "Monolithic high-power dual-wavelength GaAlAs laser array", *p. 904-p. 905; FIG. 1 *.

Patent Abstracts of Japan, vol. 9, No. 258 (E-350) (1981), 16 Oct. 1985 & JP-A-60 107886 (Nippon Denki K.K.) 13/6/85 *Abstract* Classifications: H 01 S 3/19 H01 S 3/23 and G 11 B 7/12.

Technical Digest of the International Electron Devices Meeting, Washington, D.C., 7-9 Dec. 1981, pp. 443-446, IEEE, New York; T. Hayakawa et al: "Highly Reliable and Mode Stabilized (GaAl) as Double Heterostructure Visible Lasers on p-GaAs Substrate", p. 43, Introduction, p. 446, Conclusions, FIG. 1.

Primary Examiner—Frank Gonzalez
Attorney, Agent, or Firm—Irell & Manella

[57] ABSTRACT

An optical memory semiconductor laser apparatus incorporating a recording semiconductor laser device for an optical memory and a replaying semiconductor laser device for an optical memory therein into a single body, wherein the oscillation threshold current of replaying semiconductor laser device is smaller than that of recording semiconductor laser device.

5 Claims, 1 Drawing Sheet

OPTICAL MEMORY SEMICONDUCTOR LASER APPARATUS

This application is a continuation, of application Ser. No. 870,511, filed June 4, 1986 (now abandoned).

BACKGROUND OF THE INVENTION

1. Field of the Invention

This invention relates to a monolithic optical memory semiconductor laser apparatus in which a recording semiconductor laser device and a replaying semiconductor laser device are incorporated into a single body.

2. Description of the Prior Art

There are optical disc-filing apparatus, etc., in which as soon as image information is recorded on an optical disc by a recording semiconductor laser device, it is replayed by a replaying semiconductor laser device and if it is recognized that the image information contains errors, a corrected form is rerecorded on the next track of the optical disc. When a recording semiconductor laser device and a replaying semiconductor laser device are monolithically integrated on a single semiconductor substrate, a single optic can be shared for the recording and replaying operations, making the optical disc-filing apparatus extremely simple.

Generally, it is necessary for a recording semiconductor laser device to produce as high an output power as possible. In order to prevent deterioration of the recording semiconductor laser device in the production of a high output power, the light-emitting face of the laser device is covered with a protective film such as alumina ($Al_2O_3$) film, etc., having a thickness of $(\frac{1}{4})\lambda$ (wherein $\lambda$ is the wavelength of laser light from the laser device).

Since the recording semiconductor laser device and the replaying semiconductor laser device are monolithically formed on a single semiconductor substrate, when the above-mentioned protective film is formed on the recording semiconductor laser device, the formation of the protective film on the replaying semiconductor laser device is unavoidable, which causes reflected light from the optical disc, etc., to strike the replaying semiconductor laser device. Due to such reflected light, the resonance frequency $f_0$ during the operation of the relaxation oscillation of the replaying semiconductor laser device is reduced as indicated by the equation (1):

$$f_0 = fr \times \frac{1}{\tau} \times \frac{2nld}{c} \times \frac{(F/R_f)^{\frac{1}{2}}}{1 - R_f} \quad (1)$$

wherein $fr$ is the resonance frequency of the relaxation oscillation of the replaying semiconductor laser device and represented by the equation (2):

$$fr = \frac{1}{2\pi} \times \frac{1}{\sqrt{\tau_s \cdot \tau_p}} \times \frac{Id - Ith}{Ith} \quad (2)$$

$\tau_s$ is the life of the carrier, $\tau_p$ is the life of photons, Id is the driving current, Ith is the oscillation threshold current, $\tau$ is the time required for an optical signal to take a round trip between the semiconductor laser device and the optical disc, C is the light velocity, $R_f$ is the reflection index of the semiconductor laser device, n is the refractive index of the semiconductor laser device, and ld is the cavity length of the semiconductor laser device.

Given that the reflection index F of the above-mentioned optical disc is 0.01 and the reflection index $R_f$ of the replaying semiconductor laser device is 0.02, even though the resonance frequency fr of the replaying semiconductor laser device is several GHz, the replaying semiconductor laser device exhibits a resonance frequency $f_0$ of as low as about 20–30 MHz, which is close to the frequency zone (from several MHz to several tens of MHz) of the analog signal to be replayed. Therefore, noise intensities in the replaying signal are increased and the replaying signal deteriorates, which causes reading errors which make it difficult to determine as to whether or not the recording semiconductor laser device itself is malfunctioning.

In order to solve the above-mentioned problem, it is conceivable to mask the light-emitting face of the replaying semiconductor laser device when the above-mentioned protective film is formed on the light-emitting face of the recording semiconductor laser device. However, such a process is not practical because extremely precise processing is required which makes production cost significantly high.

SUMMARY OF THE INVENTION

The optical memory semiconductor laser apparatus of this invention, which overcomes the above-discussed and numerous other disadvantages and deficiencies of the prior art, incorporates a recording semiconductor laser device for an optical memory and a replaying semiconductor laser device for an optical memory therein into a single body, wherein the oscillation threshold current of said replaying semiconductor laser device is smaller than that of said recording semiconductor laser device.

Both the replaying semiconductor laser device and the recording semiconductor laser device are, in a preferred embodiment, of a VSIS laser device.

The width of the V-channel of said replaying semiconductor laser device is, in a preferred embodiment, smaller than that of the V-channel of said recording semiconductor laser device.

Thus, the invention described herein makes possible the objects of (1) providing a monolithic semiconductor laser apparatus in which the oscillation threshold current of the replaying semiconductor laser device is smaller than that of the recording semiconductor laser device to thereby heighten the resonance frequency $f_0$ during the operation of the replaying semiconductor laser device while the output power of the recording semiconductor laser device is maintained at a given high level, so that undesirable noise resulting from reflected light from an external optical disc, etc., during the operation of the replaying semiconductor laser device can be suppressed; (2) providing a monolithic semiconductor laser apparatus in which, since the oscillation threshold current of the replaying semiconductor laser device is smaller than that of the recording semiconductor laser device as mentioned above, even though a protective film is undesirably formed on the light-emitting surface of the replaying semiconductor laser device, compensation for the lowering of the resonance frequency during the operation of the replaying semiconductor laser device can be made so that the formation of such a protective film on the replaying semiconductor laser device is not necessarily prevented by a specific masking means; (3) providing a monolithic semiconductor laser apparatus which can be readily produced at low cost; and (4) providing a monolithic semiconductor laser apparatus which produces a high output power with suppressed noise.

BRIEF DESCRIPTION OF THE DRAWINGS

This invention may be better understood and its numerous objects and advantages will become apparent to those skilled in the art by reference to the accompanying drawings as follows.

DESCRIPTION OF THE PREFERRED EMBODIMENTS

Figure 1:
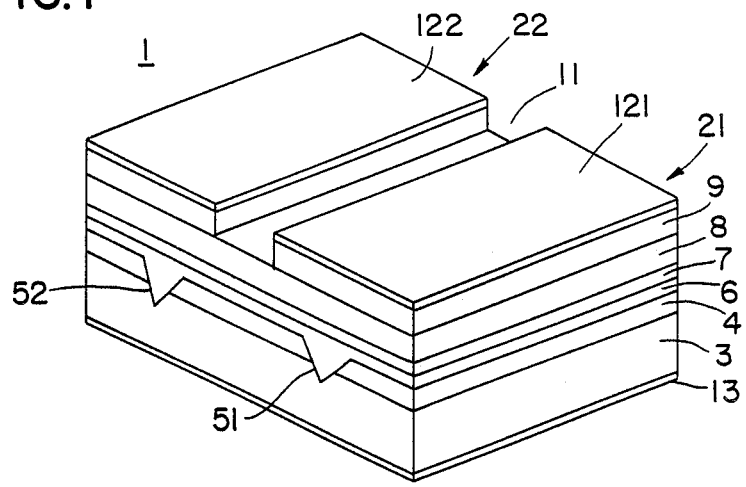
FIG. 1 is a perspective view showing a monolithic semiconductor laser apparatus of this invention.
Figure 2:
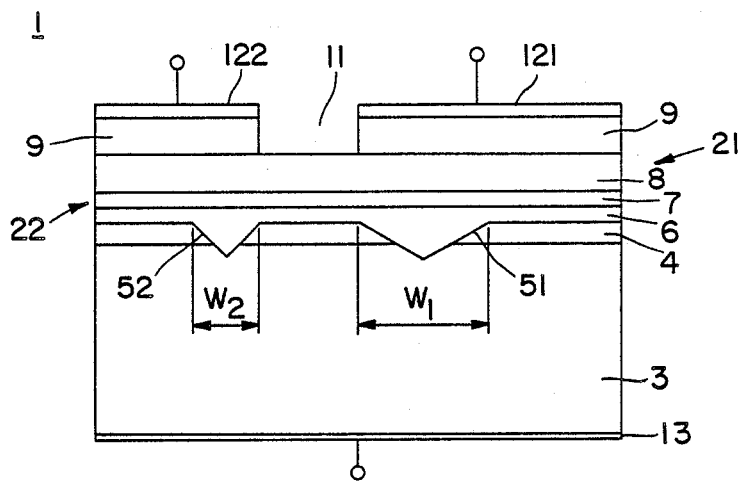
FIG. 2 is a front sectional view showing a portion parallel to the light-emitting face of the semiconductor laser apparatus shown in FIG. 1.

FIGS. 1 and 2 show a monolithic semiconductor laser apparatus 1 of this invention, in which a V-channeled substrate inner stripe (VSIS) recording semiconductor laser device 21 and a VSIS replaying semiconductor laser device 22 are incorporated on a semiconductor substrate 3 into a single body by liquid phase epitaxy.

The production process of this apparatus is as follows: An n-GaAs current blocking layer 4 preventing current from flowing from the oscillating areas of each of the semiconductor laser devices to the outside thereof is formed on a p-GaAs substrate 3 by liquid phase epitaxy, followed by a photolithographic treatment and a chemical etching treatment to form a V-channel 51 having a width of $W_1$ and a V-channel 52 having a width $W_2$ ($W_1 > W_2$), both of which function as an optical waveguide confining current therein. Then, on the current blocking layer 4 including the V-channels 51 and 52, a p-GaAlAs cladding layer 6, a p-GaAs active layer 7, an n-GaAlAs cladding layer 8, and an n-GaAs cap layer 9 are successively formed by liquid phase epitaxy. Then, ohmic contact layers are deposited on the upper face of the cap layer 9 and the back face of the semiconductor substrate 3, respectively, and then subjected to a photolithographic treatment and a chemical etching treatment to form a striped channel 11 on the cladding layer 8, resulting in n-sided electrodes 121 and 122 for the semiconductor laser devices 21 and 22, respectively, and a p-sided common electrode 13 for the semiconductor laser devices 21 and 22.

The width $W_1$ of the V-channel 51 of the recording semiconductor laser device 21 (i.e., the width of the cavity of the laser device 21) is, for example, 5 μm, while the width $W_2$ of the V-channel 52 of the replaying semiconductor laser device 22 (i.e., the width of the cavity of the laser device 22) is, for example, 3 μm. The oscillation threshold current I of the recording semiconductor laser device 21 is 60 mA and the output power is about 40 mW, while the oscillation threshold current Ith of the replaying semiconductor laser device 22 is about 35 mA.

Figure 3:
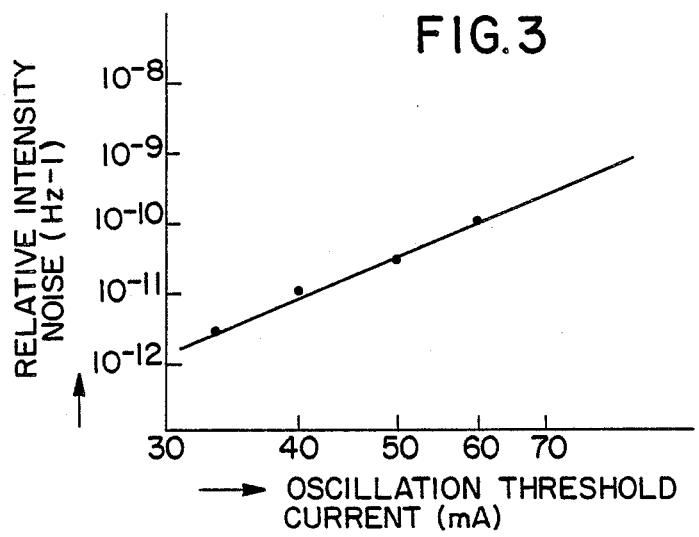
FIG. 3 is a characteristic curve showing the relationship between the noise intensity and the threshold current with regard to the semiconductor laser apparatus shown in FIG. 1.

As mentioned above, the width ($W_2 = 3$ μm) of the stripe of the cavity portion of the replaying semiconductor laser device 22 is smaller than the width ($W_1 = 5$ μm) of the stripe of the cavity portion of the recording semiconductor laser device 21, so that the resonance frequency $f_0$ of the relaxation oscillation of the replaying semiconductor laser device 22 can be heightened, and suppression of the relative intensity noise (RIN) can be attained as indicated by the operation characteristic curve shown in FIG. 3 in which the RIN is about $1 \times 10^{-11}$ $Hz^{-1}$ at the highest.

Since the optical memory semiconductor laser apparatus is designed, as mentioned above, such that the oscillation threshold current of the replaying semiconductor laser device is smaller than that of the recording semiconductor laser device, although a protective film such as an alumina film, etc., is formed not only on the light-emitting face of the recording semiconductor laser device, but also on the light-emitting face of the replaying semiconductor laser device, the lowering of the oscillation frequency during the operation of the replaying semiconductor laser device due to the said protective film thereon can be compensated.

It is understood that various other modifications will be apparent to and can be readily made by those skilled in the art without departing from the scope and spirit of this invention. Accordingly, it is not intended that the scope of the claims appended hereto be limited to the description as set forth herein, but rather that the claims be construed as encompassing all the features of patentable novelty that reside in the present invention, including all features that would be treated as equivalents thereof by those skilled in the art to which this invention pertains.

What is claimed is:

1. An optical memory semiconductor laser apparatus incorporating a recording semiconductor laser device for an optical memory and a replaying semiconductor laser device for an optical memory, therein into a single body, wherein both said replaying semiconductor laser device and said recording semiconductor laser device are of a VSIS laser device comprising a semiconductor substrate with a V-channel that is formed through a current blocking layer, the width of the V-channel of said replaying semiconductor laser device being smaller than that of the V-channel of said recording semiconductor laser device, and the oscillation threshold current of said replaying semiconductor laser device is smaller than that of said recording semiconductor laser device.

2. In an optical memory semiconductor laser apparatus, the apparatus comprising a semiconductor substrate, a current blocking layer disposed on said substrate, first and second V-channels formed in a parallel manner through said current blocking layer and in said substrate, a first cladding layer disposed on said current blocking layer and filing said V-channels, an active layer formed above said first cladding layer, wherein said first and second V-channels function as first and second optical waveguides within said active layer, respectively, wherein said first and second optical waveguides respectively constitute recording and replaying semiconductor laser devices, the width of said second V-channel being smaller than that of said first V-channel, and the oscillation threshold current of said replaying semiconductor laser device is smaller than that of said recording semiconductor laser device.

3. An optical memory semiconductor laser apparatus according to claim 2, wherein the width of said first V-channel is about 5 μm and the width of said second V-channel is about 3 μm.

4. An optical memory semiconductor laser apparatus according to claim 2 wherein the threshold current of said replaying semiconductor laser device is about 35 mA and the threshold current of said recording semiconductor laser device is about 60 mA.

5. An optical memory semiconductor laser apparatus according to claim 2 wherein said substrate, said current blocking layer and said active layer are composed of GaAs and said cladding layer is composed of AlGaAs.

* * * * *